US006987400B2

(12) United States Patent
Toro-Lira

(10) Patent No.: US 6,987,400 B2
(45) Date of Patent: Jan. 17, 2006

(54) TESTING FLAT PANEL DISPLAY PLATES USING HIGH FREQUENCY AC SIGNALS

(75) Inventor: Guillermo L. Toro-Lira, Sunnyvale, CA (US)

(73) Assignee: Panelvision Technologies, Los Gatos, CA (US)

( * ) Notice: Subject to any disclaimer, the term of this patent is extended or adjusted under 35 U.S.C. 154(b) by 0 days.

(21) Appl. No.: 10/442,556

(22) Filed: May 20, 2003

(65) Prior Publication Data

US 2004/0232939 A1 Nov. 25, 2004

(51) Int. Cl.
G01R 31/305 (2006.01)
(52) U.S. Cl. ........................ 324/770; 324/751; 324/501
(58) Field of Classification Search ............... 324/73.1, 324/501, 750–752, 770, 158.1; 250/305, 250/310; 345/87; 349/42, 142–143
See application file for complete search history.

(56) References Cited

U.S. PATENT DOCUMENTS 5,057,775 A * 10/1991 Hall ........................... 324/770
5,081,687 A 1/1992 Henley et al. ................. 382/8
5,170,127 A 12/1992 Henley ....................... 324/658
5,285,150 A 2/1994 Henley et al. .............. 324/158
5,363,037 A 11/1994 Henley et al. ........... 324/158.1
5,369,432 A 11/1994 Kennedy .................... 348/181
5,548,357 A 8/1996 Appel et al. .................. 353/69
5,614,839 A * 3/1997 Bosacchi .................... 324/770
5,650,844 A 7/1997 Aoki et al. ................. 356/237
5,734,158 A 3/1998 Nagashima et al. ......... 250/225
5,781,258 A 7/1998 Dabral et al. ................. 349/73
5,793,221 A 8/1998 Aoki .......................... 324/770
5,852,480 A 12/1998 Yajima et al. ................ 349/40
5,914,764 A 6/1999 Henderson .................. 349/161
5,982,190 A * 11/1999 Toro-Lira ................... 324/770
5,994,916 A 11/1999 Hayashi ...................... 324/770
6,033,281 A 3/2000 Toro-Lira .................... 445/63
6,056,448 A 5/2000 Sauter et al. ................ 385/92
6,090,545 A 7/2000 Wohlstadter et al. .......... 435/6
6,140,045 A 10/2000 Wohlstadter et al. .......... 435/6
6,150,833 A 11/2000 Lin et al. .................... 324/770
6,232,616 B1 5/2001 Chen et al. ............ 250/559.45
6,249,329 B1 6/2001 Dabral et al. ................. 349/73
6,281,701 B1 * 8/2001 Yang et al. ................. 324/770
6,353,466 B1 3/2002 Park ............................ 349/58
6,417,686 B1 7/2002 Yaniv et al. ................ 324/770
RE37,847 E 9/2002 Henley et al. .............. 382/141
6,552,563 B1 4/2003 Yaniv et al. ................ 324/770

OTHER PUBLICATIONS

Schmid et al., "Testing LCD Matrixes with E-Beams", Jun. 1, 2001, Applied Materials-AKT Feldkirchen, Germany, 4 pp.

* cited by examiner

*Primary Examiner*—Minh N. Tang
(74) *Attorney, Agent, or Firm*—Thelen Reid & Priest LLP

(57) ABSTRACT

Methods of and apparatus for detecting pixel element defects in flat panel display (FPDs). Floating pixel elements (FPes) of uncompleted active plates in a manufacturing process are activated with high frequency AC test signals having frequencies higher than frequencies encountered by pixels of completely manufactured FPDs during normal display operation. Application of such high frequency test signals allows detection of pixel defects of pixel elements that exhibit an electrical open circuit at normal display operation frequencies. Because the methods and apparatus allow testing prior to FPD plates being completely manufactured and prior to FPD final assembly, pixel defects can be detected early in the display manufacturing process, thereby resulting in a substantial reduction in production costs.

3 Claims, 17 Drawing Sheets

TESTING FLAT PANEL DISPLAY PLATES USING HIGH FREQUENCY AC SIGNALS

FIELD OF THE INVENTION

The present invention relates generally to testing flat panel displays (FPDs). More specifically, the present invention relates to testing FPDs using high frequency alternating current (AC) signals.

BACKGROUND OF THE INVENTION

Flat panel displays (FPDs) are increasingly replacing the conventional cathode ray tube (CRT) as the display type of choice. FPDs are electronic displays in which a flat screen is formed by a two-dimensional array of display elements (or "pixels"). They can be manufactured from a variety of different display technologies. One common display technology utilizes an array of light emitting diodes (LEDs) to form the FPD. An LED is a solid-state electronic device, more specifically a p-n junction or "diode", which emits photons (i.e. light) when forward biased. The light emitting effect is referred to as injection electroluminescence, a light emitting phenomenon that occurs when minority charge carriers generated by an applied electric field recombine with charge carriers of the opposite type in the diode. The energy of the emitted photon, which determines the wavelength of the emitted light, varies with the band gap of the semiconductor material used (e.g., GaP, GaAs, GaN, etc.) to form the LED.

Typically, control of the LEDs in an FPD is performed using one of two approaches. According to the first approach, the LEDs are controlled by a row-column grid control pattern and associated row and column drivers/controllers. This approach is known as the "passive matrix" approach. The second approach, known as the "active matrix" approach, uses one or more control transistors at each pixel site to control pixel emission. Because each pixel is controlled by its own associated control transistor(s), active matrix LED FPDs consume less power than passive matrix FPDs, and are able to turn pixels on and off faster than passive matrix displays.

Another display technology of recent interest is based on the so-called Organic Light Emitting Diode (OLED). Operation of an OLED is similar to that of an inorganic semiconductor LED described above. When two organic materials, one with an excess of mobile electrons and the other with a deficiency, are placed in close contact, a junction region is formed. When a small forward bias is applied across the diode, electron-hole pairs are created, which upon recombination produce photons as described above. OLEDs are attractive for use in FPDs since they provide excellent display and viewing characteristics, can be manufactured on a flexible substrate (e.g. plastic), do not require high-temperature processing to dope them, and have fast element response times.

OLED FPDs are formed by etching an array of pixel elements into a substrate. In the array, portions of the active pixel elements, including thin film transistor (TFT) devices, storage capacitors and ITO patterns are formed on the substrate. The substrate is then coated with organic materials that form the light emitting portion (i.e. the diode) of the OLED. Further details concerning the manufacturing of OLED FPDs may be found in U.S. Pat. No. 5,688,551, which describes the first application of organic materials for OLED FPD manufacturing.

FIG. 1A shows a simplified diagram of a top view of a small six-column by four-row (6×4) OLED FPD 10. FPD 10 comprises an array of pixel elements 100, a row electrical driver 102, and a column electrical driver 104. During operation, if, for example, column electrical driver 104 activates column 3 and row electrical driver 102 activates row 2, then the pixel shown in black in FIG. 1A will be activated and light emission from this particular pixel element will result. A side view of the OLED FPD 10 in FIG. 1A is shown in FIG. 1B. There, the various layers of the FPD can be seen, including substrate 106, organic layer 108, and metal layer 109.

FIG. 1C shows a schematic diagram of a typical active pixel element 100 that is used in the OLED FPD in FIGS. 1A and 1B. Pixel element 100 is formed by two TFT devices 110 and 112, a storage capacitor 114, and an LED 116. TFT 110 acts like an analog electrical switch, which closes (i.e. turns ON) when the row selection signal 118 is active. Upon TFT 110 turning ON, the voltage present at column line 120 provides a charge source, which allows storage capacitor 114 to charge to a predetermined value. This charge is stored on storage capacitor 114, until a subsequent writing cycle corresponding to the display frame rate. As alluded to above in the discussion of non-organic LED pixel elements, this method of energizing a display pixel is referred to as "active", due to the presence of TFT 110—an electronically active element. Active pixel elements are not unique to OLED FPDs. Indeed, for more information concerning active FPDs, reference may be made to the book "Color TFT Liquid Crystal Displays," T. Yamasaki et al., edited by SEMI Standard FPD Technology Group, 1996.

FIG. 1D shows how the luminance of pixel element 100 is controlled. As shown, a voltage Vs present on storage capacitor 114 controls the transconductance (Gm) of TFT 112. A variation in Gm causes a variation in the current Id flowing into LED 116 and, consequently, the light emission luminance of LED 116. In essence, TFT 112 behaves like an electrically isolated voltage controlled current source in response to the voltage value Vs.

Turning now to the topic of defects in FPDs, it is well known that vast majority of defects in FPDs are found in the active plates of the FPDs. Because of this, during the manufacturing of FPDs, the active plates are typically tested prior to finally assembling the displays. By testing prior to final assembly, pixel defects can be detected early in the display manufacturing process, thereby resulting in a reduction in production costs.

Defects also commonly arise in the active plate of OLED displays. Accordingly, it would be desirable to test the active plates used in OLED displays prior to final assembly (e.g. prior to application of organic layer 108 and metal layer 109) as well. This desire is increased when it is recognized that organic layer 108 contributes substantially to the total display manufacturing costs. Besides material costs, a primary reason for the high cost is that atmospheric sealing methods must be employed to protect currently available organic emissive layers. Without proper protection from the atmosphere, the expected lifetime of organic layers can be substantially compromised. For more information on this topic, see the article "Microdisplays Based Upon Organic Light-Emitting Diodes," W. E. Howard, et al., IBM J. RES. & DEV., vol. 45 no. 1, January 2001.

Unfortunately, testing the active plates prior to applying the organic and metal layers presents significant challenges since each pixel element output is in essence electrically floating, as shown schematically in FIGS. 2A and 2B. Specifically, FIG. 2A shows a top view of the OLED FPD plate prior to it being coated with the organic and metal layers 108 and 109 in FIG. 1A, and FIG. 2B shows that, because LED 116 is absent, each pixel element 100 is essentially a floating pixel element (fpe), i.e., an open electrical circuit.

SUMMARY OF THE INVENTION

Methods of and apparatus for detecting pixel element defects in flat panel display (FPDs) are disclosed. Floating pixel elements (fpes) of uncompleted active plates in a manufacturing process are activated with a high frequency test signal. In response to the activation signal, a high frequency output signal is produced by a voltage divider formed by an impedance of the fpe under test and an impedance presented by high frequency elements (e.g. stray capacitances) associated with the fpe under test. A signal characteristic (e.g. the amplitude) of the output signal is compared to an expected characteristic to determine the presence of pixel element defects. The methods of the present invention may be performed prior to completion of the active plate, e.g., prior to forming a liquid crystal between plates of a passive matrix LCD and prior to coating a partially formed OLED active plate with light emitting organic material layers. Use of high frequency activation signals allows detection of pixel element defects that are invisible to DC test methods. Additionally, because the methods and apparatus of the present invention allow testing prior to FPD plates being completely manufactured and prior to FPD final assembly, pixel defects can be detected early in the display manufacturing process, thereby resulting in a substantial reduction in production costs.

Further aspects of the invention are described and claimed below, and a further understanding of the nature and advantages of the inventions may be realized by reference to the remaining portions of the specification and the attached drawings.

DETAILED DESCRIPTION

Embodiments of the present invention are described herein in the context of testing uncompleted FPDs. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. Unless indicated otherwise, the same reference indicators will be used throughout the drawings and the following detailed description to refer to the same or like parts.

In some types of FPDs, such as, for example, passive matrix LCDs and passive or active matrix OLED displays, at least one of the plates contain pixel elements during the manufacturing process that exhibit an open circuit condition at the intended frequency of operation or lower. For example, as discussed above, prior to coating the substrate with the organic material layers during the manufacture of an OLED FPD, the absence of the LED renders the pixel elements of the display as open circuits. In accordance with embodiments of the present invention, alternating current (AC) activation signals, of a frequency greater than, for example, the frequency of operation of an OLED FPD are applied to detect variations possibly corresponding to pixel element defects.

Figure 1A:
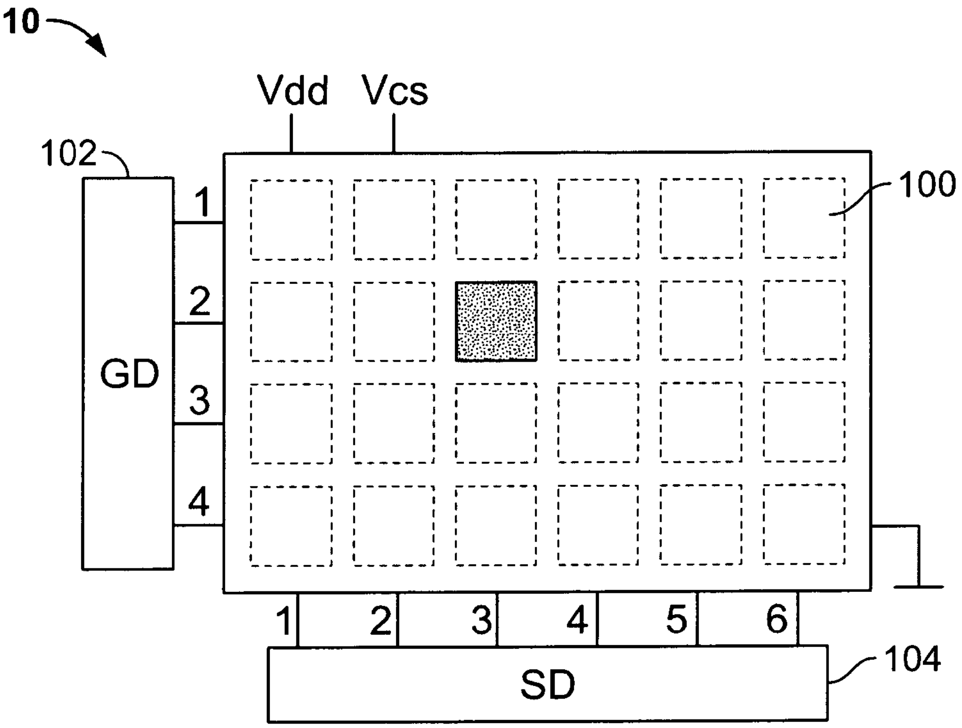
FIG. 1A shows a simplified diagram of a top view of a small, six-column by four-row (6×4) OLED FPD.
Figure 1B:
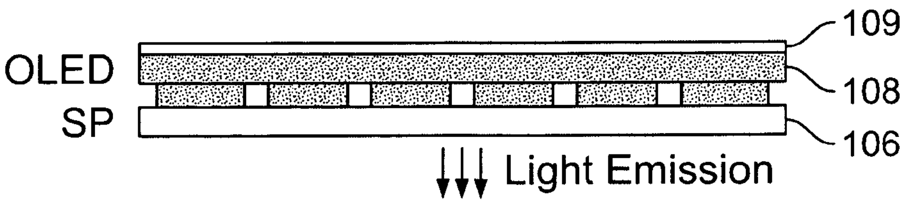
FIG. 1B shows a side view of the OLED FPD in FIG. 1A.
Figure 1C:
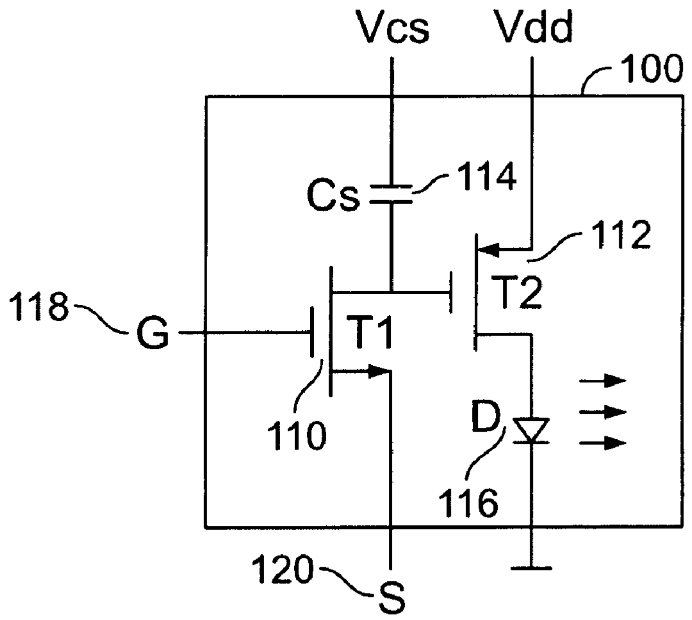
FIG. 1C shows a schematic diagram of a typical active pixel element used in the OLED FPD in FIGS. 1A and 1B.
Figure 1D:
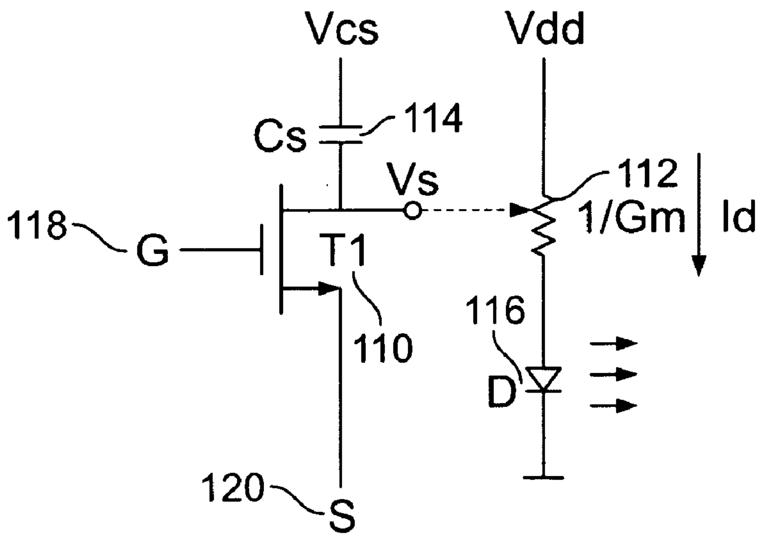
FIG. 1D shows how the luminance of a pixel element in the OLED FPD in FIGS. 1A and 1B is controlled.
Figure 2A:
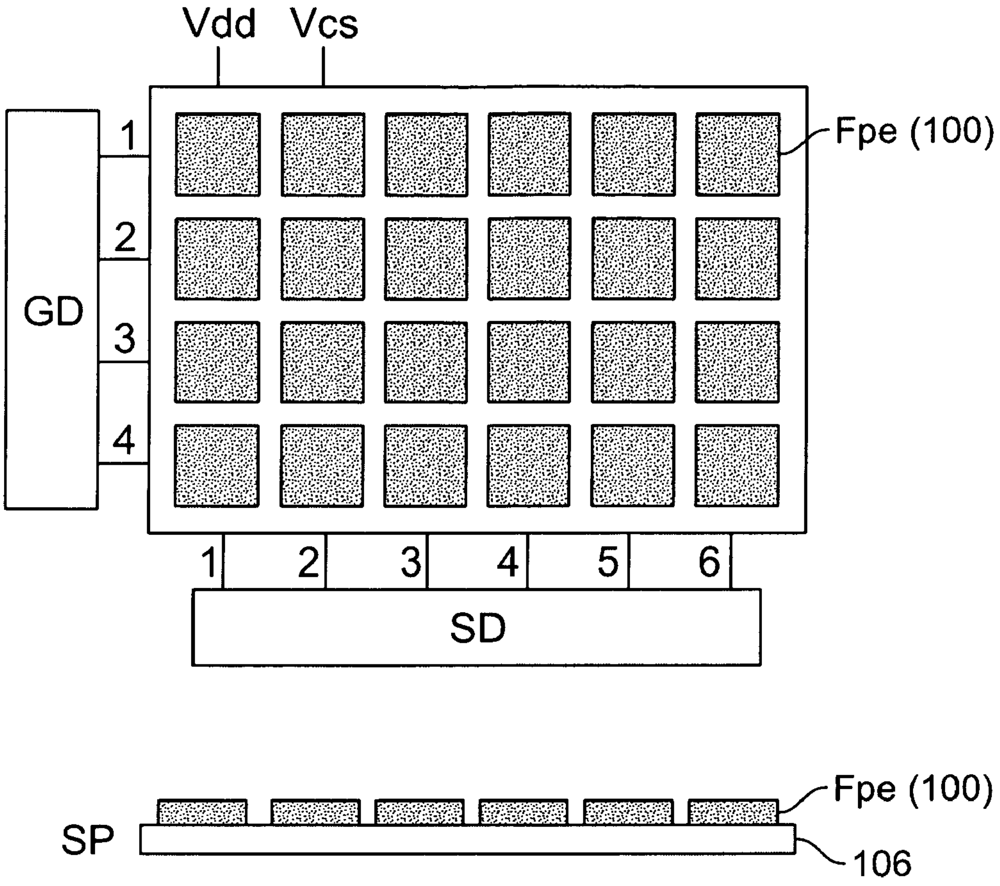
FIG. 2A shows a top view of an OLED FPD plate prior to it being coated with an organic material and other layers, thereby giving rise to a floating pixel element (fpe)
Figure 2B:
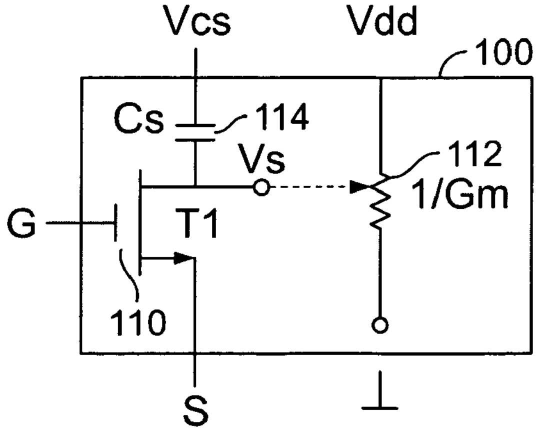
FIG. 2B shows a schematic diagram of an fpe of the OLED FPD in FIG. 2A.
Figure 3A:
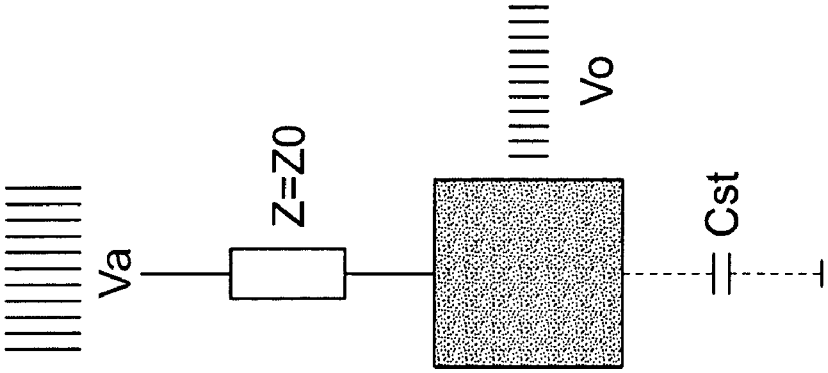
FIGS. 3A–3C show three examples in which the equivalent impedance Z of a floating pixel element has a value equal to, less than, and greater than a nominal impedance value Zo.
Figure 3B:
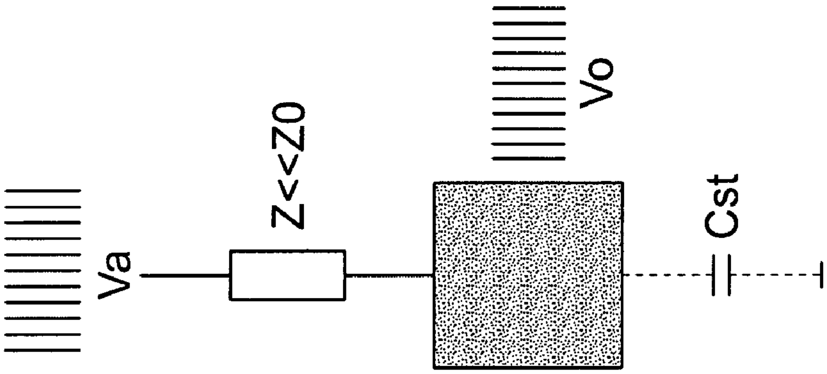
Figure 3C:
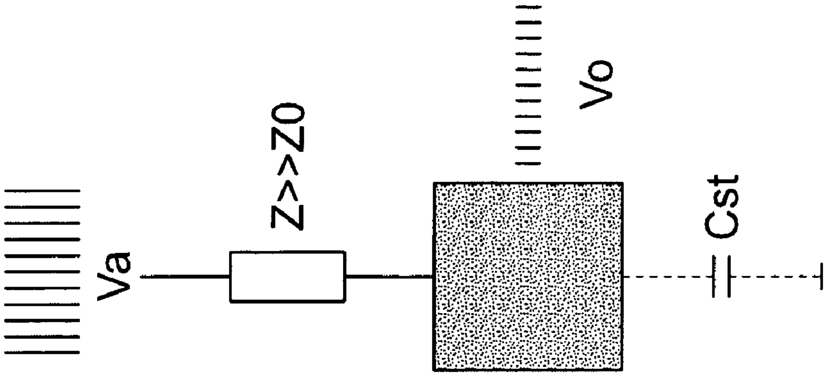

FIGS. 3A–3C show three examples in which the equivalent impedance Z of a floating pixel element has a value equal to, less than and greater than a nominal value Zo. According to embodiments of the present invention, the impedance Z of a given pixel element can be measured by applying an AC activation signal Va and measuring the amplitude of a voltage Vo provided by the voltage divider formed between the impedance presented by the pixel element and the impedance presented by stray capacitances associated with the pixel element. The stray capacitances are induced by a complex interaction of adjacent pixel elements, row and/or column activation lines and other parasitic capacitances to ground potential. According to embodiments of the invention, at a sufficiently high activation frequency, the floating pixel elements become electrically closed to ground potential. Hence, a variation on the pixel element equivalent impedance Z, which could correspond to a pixel element defect, can be measured.

The stray capacitances encountered in the active plates of FPDs can be extremely low. Accordingly, it is necessary to measure the amplitude of the signal output using a very high input impedance measuring instrument, so that the instrument itself does not affect the measurement. According to an embodiment of the invention, one such instrument that can be used is the electron beam probe, which in practice provides nearly infinite input impedance. The basic operation of the electron beam probe is very well described in the available prior art literature and will not be explained in detail here. Reference may be made to, for example, U.S. Pat. Nos. 6,075,245 and 5,982,190 by the same inventor, both of which disclose systems and methods for testing FPD arrays using electron beams.

Figure 4A:
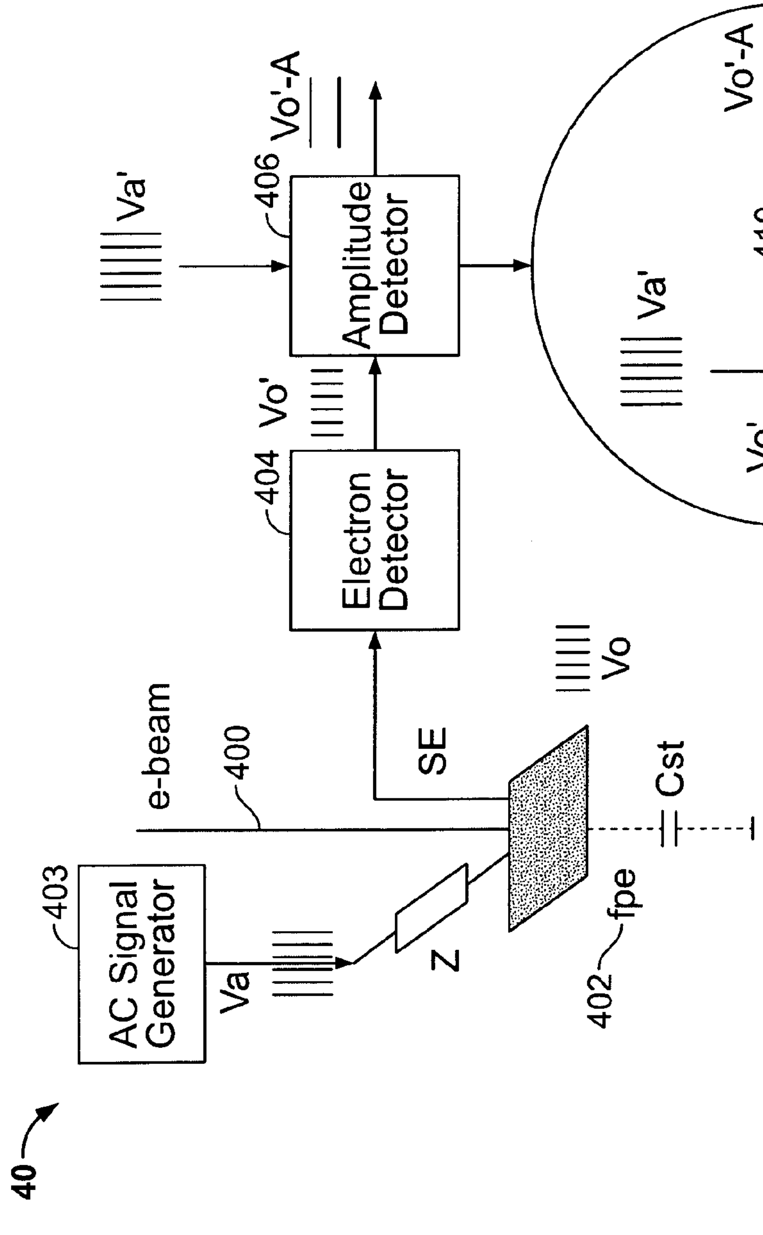
FIG. 4A shows a block diagram of a pixel testing apparatus, according to an embodiment of the present invention.

Referring to FIG. 4A, there is shown a block diagram of a pixel testing apparatus 40, according to an embodiment of the present invention. As shown, an electron beam ("e-beam") 400 is directed at a floating pixel element (fpe) 402 such that secondary electrons (SE) are emitted from the fpe's surface. To obtain the highest possible sensitivity of voltage measurement the energy of e-beam 400 may be adjusted to a value that matches the optimum beam energy for the substrate and/or other materials being irradiated. The optimum beam energy value is achieved when no charging occurs, which can cause significant voltage measurement errors. For example, for a glass substrate, the optimum beam energy is on the order of about 2 keV and for polymer/plastic substrates the optimum energy is on the order of about 400 eV. For detailed information on this subject reference is made to the book "Scanning Electron Microscopy and X-Ray Microanalysis," J. Goldstein et al., Plenum Press, 1992, which is hereby incorporated by reference.

Figure 4B:
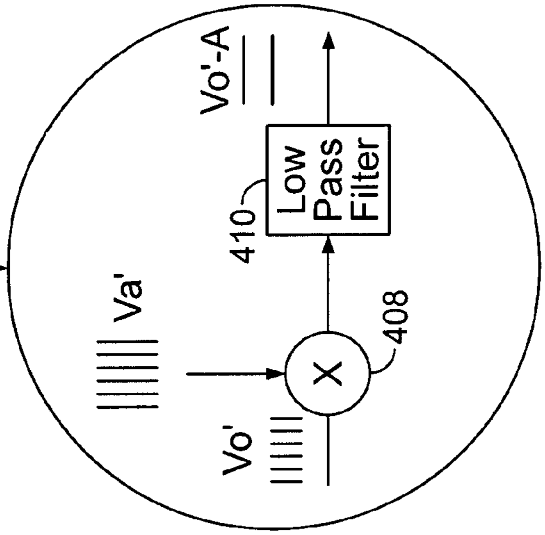
FIG. 4B shows a block diagram of a specific, exemplary synchronous detector that may be used to detect the amplitude of the output signal Vo'generated by the pixel testing apparatus in FIG. 4A.

Floating pixel element 402 is activated with at least one high frequency signal Va provided by an AC signal generator 403. The generated SE are collected by an electron detector 404 and amplified. An output signal Vo'of electron detector 404 is a signal that corresponds to Vo, which is a signal that results from voltage dividing the input activation waveform Va between the equivalent pixel impedance Z of fpe 402 and the associated impedance of stray capacitance Cst. Output signal Vo'of electron detector 404 is fed into an amplitude or envelope detector 406. Detector 406 may be any one of several types of detectors, such as, for example, a peak-to-peak detector, a synchronous detector, or a matched filter. FIG. 4B shows a block diagram of a specific exemplary synchronous detector that may be used. This synchronous detector operates similarly to the electronic circuit used in radio frequency AM demodulation. It comprises an analog multiplier 408, which provides the product of the incoming signal Vo' and an image of the display activation signal Va'. Depending on any time delay generated during the transfer of the signal Va through the panel and to the output of the electron detector, the image of the display activation signal Va' may need to be electronically delayed in the same proportion to provide optimum detection operation. The output of multiplier 408 is fed into a low pass filter 410, which provides an output having the desired amplitude or envelope properties of the signal Vo'. For a detailed description of the theory of operation of a synchronous detectors of this type refer to, for example, "Introduction to Communication Systems," F. G. Stremler, Addison-Wesley Publishing Company, 1982. Whereas specific exemplary embodiments of what may be used to detect the amplitude or envelope of output signal Vo' have been provided, those of ordinary skill in the art will readily appreciate that other methods and apparatus for detecting the amplitude or envelope properties of output signal Vo' may be used.

Figure 5A:
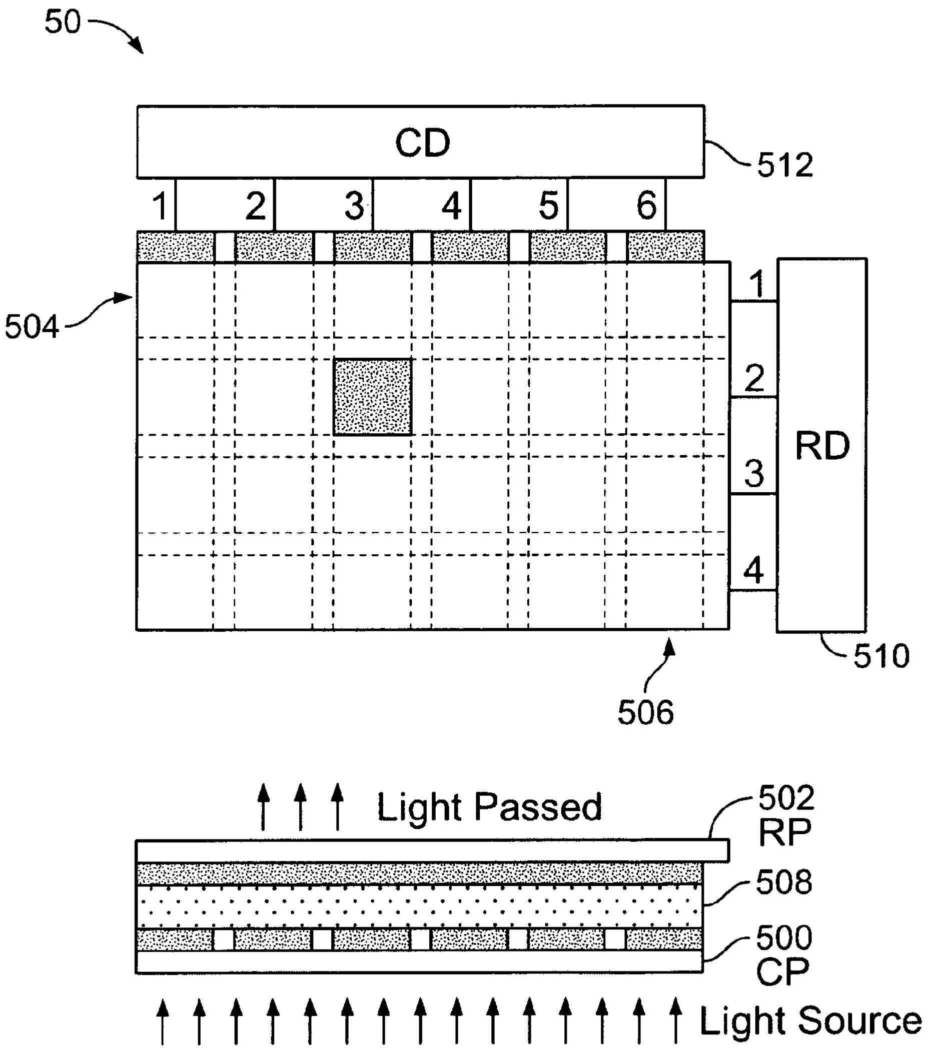
FIG. 5A (Prior Art)
FIGS. 5A and 5B show a prior art passive matrix LCD FPD, which has row and column glass plates etched with rows and columns of indium tin oxide (ITO)
Figure 5B:
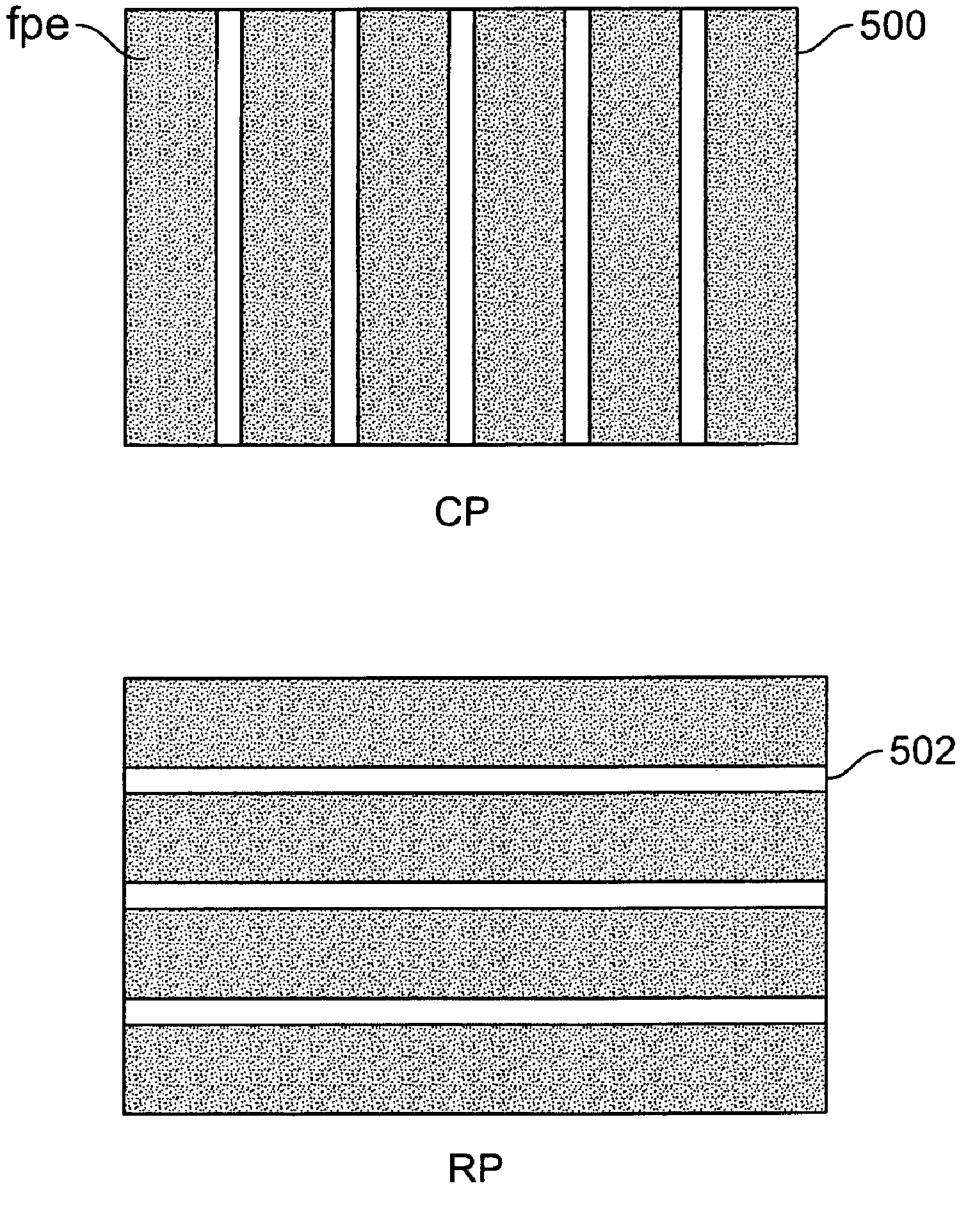
FIG. 5B (Prior Art)

Referring now to FIGS. 5A and 5B, there is shown a prior art passive matrix LCD FPD 50. LCD FPD 50 comprises row and column glass plates 500 and 502, each of which are etched with patterns of rows 504 and columns of 506 of indium tin oxide (ITO), or other transparent electrical conductor, and a liquid crystal material 508 disposed between the row and column plates 500 and 502. A display pixel is formed at the intersection of each row and column 504 and 506. During operation, a pixel is activated by applying appropriate row and column drive signals from a row electrical driver 510 and a column electrical driver 512. For example, in the representative example of a small six-column by four-row (6×4) display shown in FIGS. 5A and 5B, the pixel shown in black is activated if the column electrical driver 512 activates column 3 and the row electrical driver 510 activates row 2.

Figure 6A:
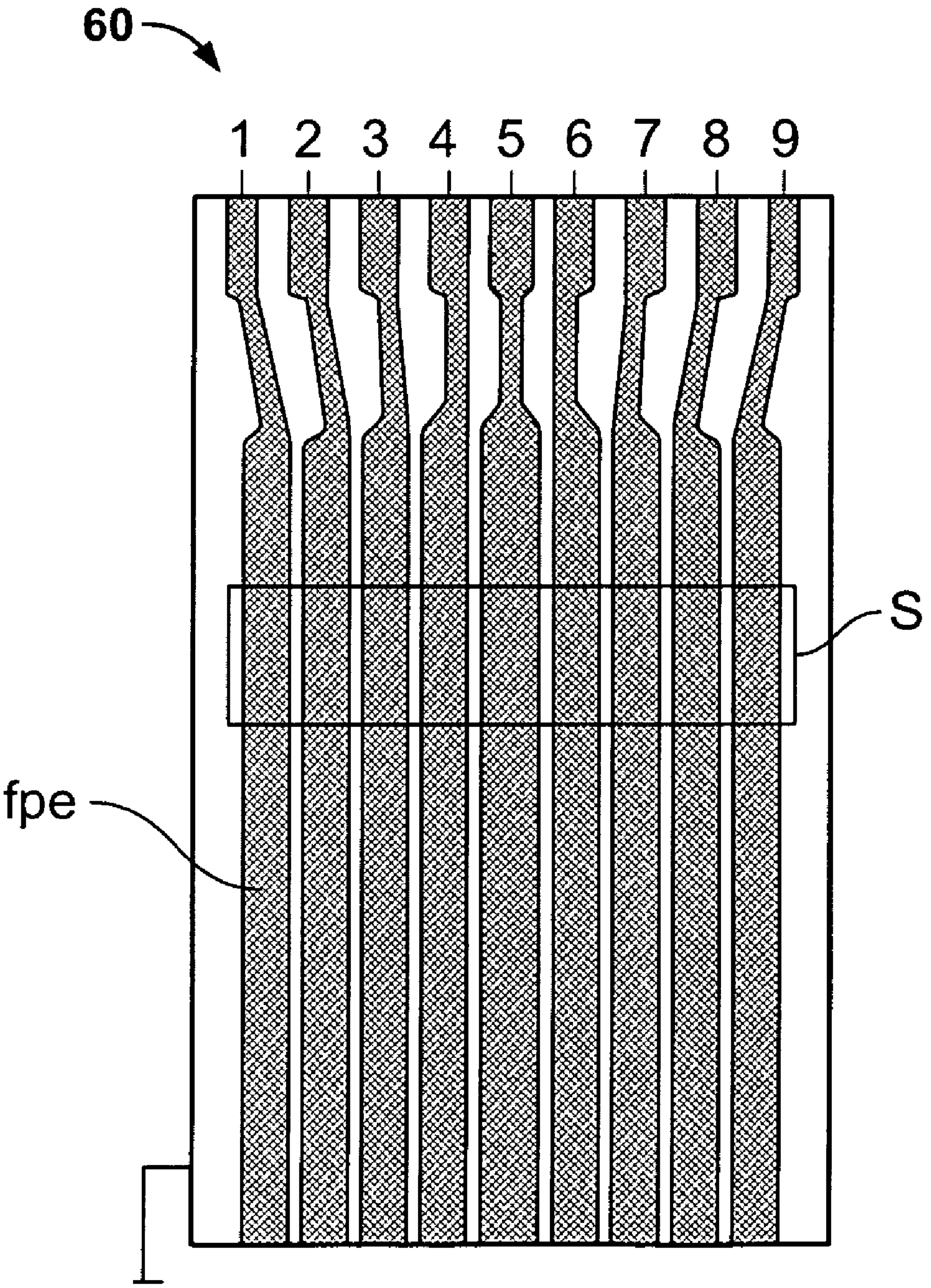
FIG. 6A shows a representative example of a thin LCD glass plate having nine columns etched with ITO.
Figure 6B:
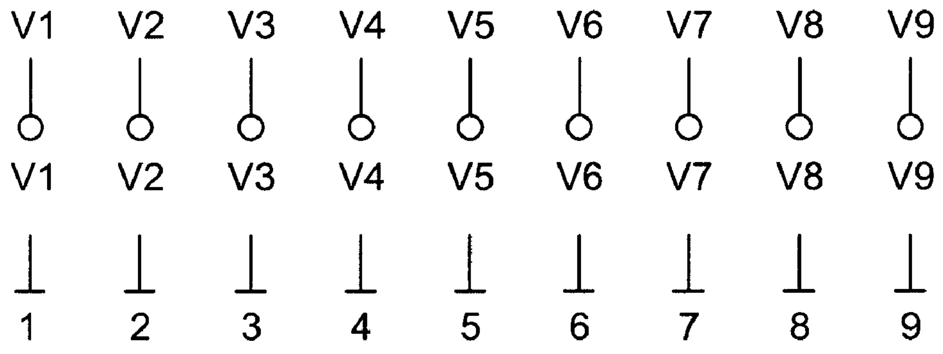
FIG. 6B shows that, in the absence of a liquid crystal, each ITO column of the LCD glass plate in FIG. 6A is floating with respect to its activation voltage contacts (V1 though V9) and its reference voltage potential (ground)
Figure 6C:
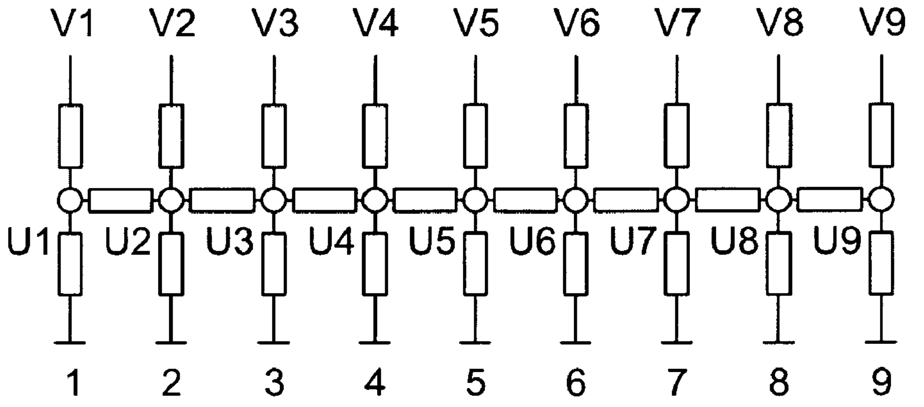
FIG. 6C shows a distributed network model that may be used to represent high frequency elements (e.g. stray impedances) and be used as an accurate model the LCD glass plate, including the fpes, in FIG. 6A.

According to an embodiment of the present invention, the electrical conduction characteristics of the rows and columns 504 and 506 of plates 500 and 502 may be tested prior to be assembled into a complete display containing the liquid crystal, polarizers and other components. FIG. 6A shows a representative example of a thin LCD glass plate 60 having nine columns etched with ITO. In the absence of the liquid crystal, and at the normal frequency of operation of the LCD, each ITO column should be floating with respect to its activation voltage contacts (V1 though V9) and its reference voltage potential (ground), as is shown schematically in FIG. 6B. This floating condition is indicated by the label "fpe" (i.e. floating pixel element) in FIG. 6A. At higher activation frequencies, however, the simple electrical model of FIG. 6B becomes less of an accurate representation of the electrical characteristics of plate 60. One reason for this is that, at higher frequencies, impedances of stray capacitances and other parasitic elements must be accounted for, but are not in the model of FIG. 6B. To represent these high frequency elements, a distributed network model, like that shown in FIG. 6C, may be used. According to this model, each column presents impedances connected to the voltage sources, adjacent columns and ground potential. Unexpected values of these impedances may be the consequence of, among other reasons, ITO conductor defects such as open circuits and shorts, bad electrical connections, ITO material uniformity variations, adjacent column proximity capacitances, and stray capacitances to ground potential through the glass substrate.

Figure 7A:
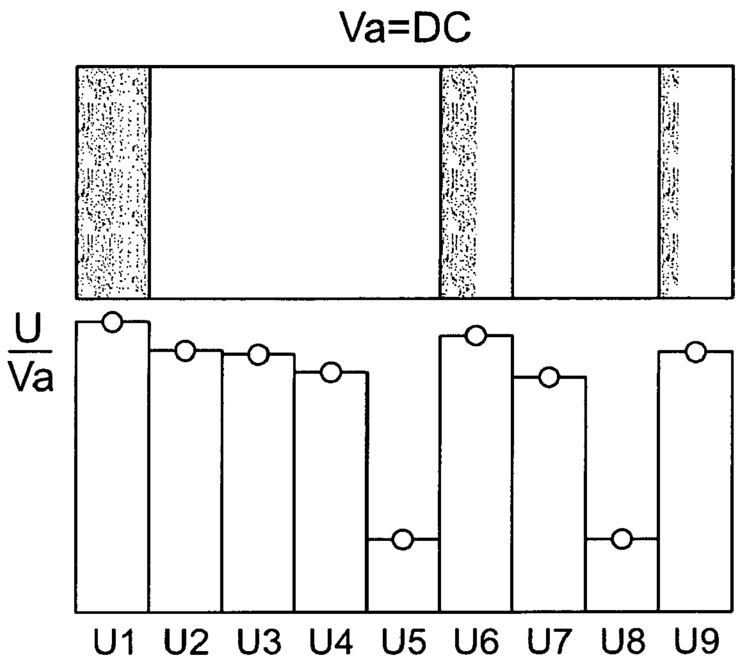
FIG. 7A shows test results when a column plate, such as a column plate of the LCD plate in FIG. 6A, is measured using a DC test signal.
Figure 7B:
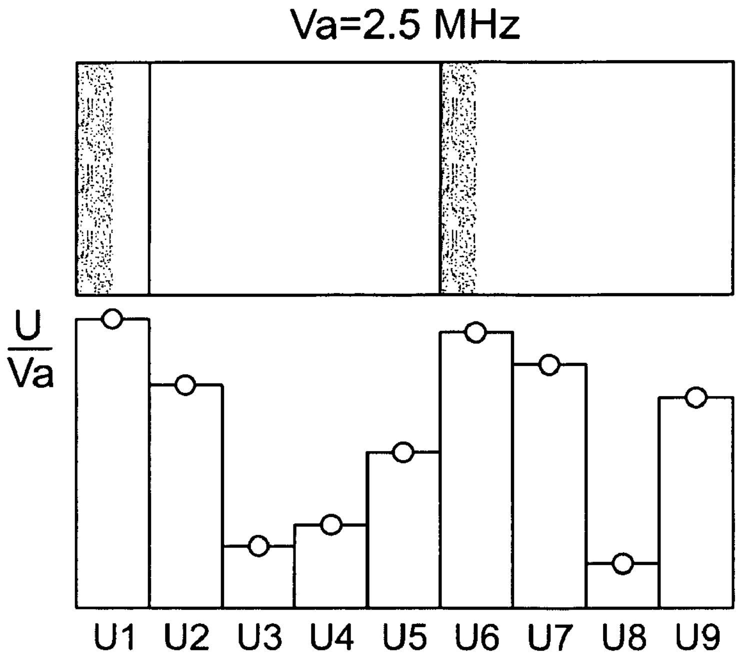
FIG. 7B shows test results when a column plate, such as a column plate of the LCD plate in FIG. 6A, is measured using the test methods described in connection with the test apparatus shown in FIG. 4, according to an embodiment of the present invention.
Figure 7C:
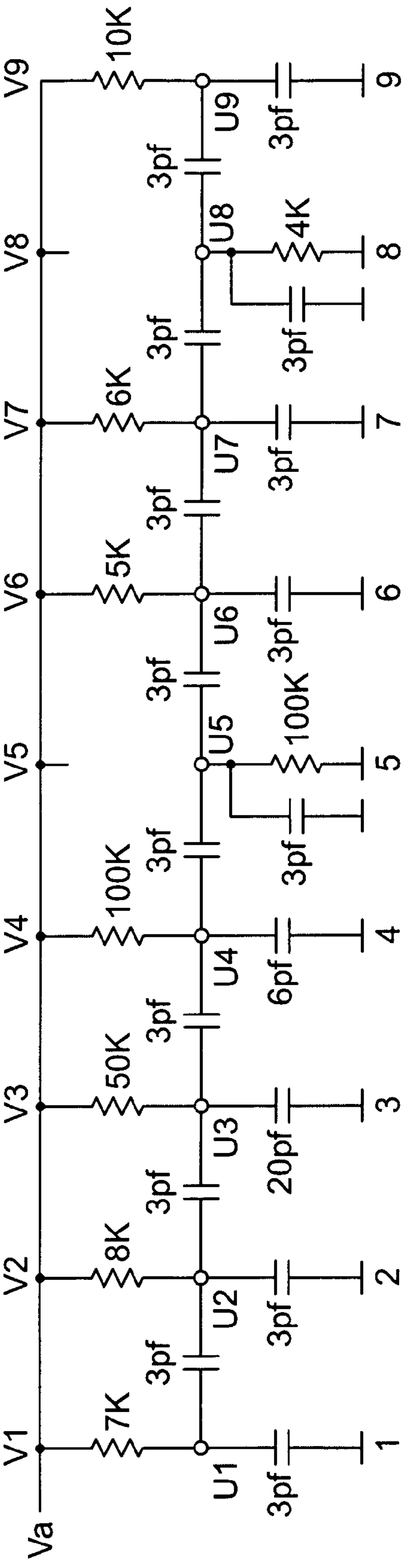
FIG. 7C shows a conduction network model of the LCD plate in FIG. 6A obtained from a careful electrical measurement using a sensitive mechanical contact electrical multimeter and adjacent column capacitance calculations taking into account plate geometries.
Figure 7D:
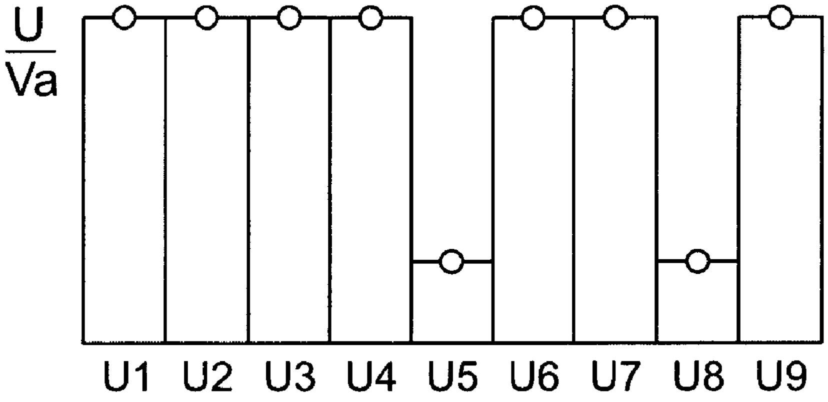
FIG. 7D shows a theoretical solution of the conduction network in FIG. 7C when a DC test signal is used as the activation signal.
Figure 7E:
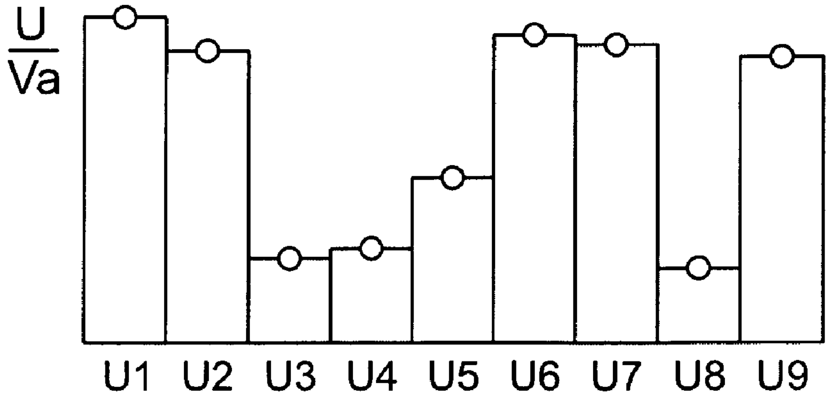
FIG. 7E shows a theoretical solution of the conduction network in FIG. 7E when an AC test signal is used as the activation signal, according to an embodiment of the present invention.

FIGS. 7A–7E compare test results when a column plate, such as a column plate of LCD plate 60 in FIG. 6A, is measured using a DC test signal to test results collected when using the test methods described in connection with the test apparatus shown in FIG. 4A, according to an embodiment of the present invention. Specifically, FIG. 7A shows test results for the case where the plate is activated by a DC signal, whereas FIG. 7B shows test results using the apparatus and methods of the present invention. For the test results shown, the activation frequency is set at 2.5 Mhz. However, those skilled in the art will readily understand that other activation frequencies may be used. Additionally, for simplicity, a DC test signal of Va=10V DC was applied to each column in the DC test case, and a sinusoidal AC test signal of Va=+/−10V AC was applied to each column in the AC test case. The top portions of FIGS. 7A and 7B show a two-dimensional data map of hundreds of very closely spaced electron probe measurements. Lighter shades in the maps indicate higher detected voltages, and darker shades in the maps indicate lower detected voltages. The measurement area corresponds to the area S depicted in FIG. 6A. FIGS. 7A and 7B also show numerical graphs of the average of the measured values for each column. The results obtained with both methods show significant differences. Whereas both approaches reveal that columns 5 and 8 have severe conduction defects, only the approach using the methods and apparatus of the present invention is capable of revealing additional defects. A careful electrical measurement using a sensitive mechanical contact electrical multimeter and adjacent column capacitance calculations taking into account plate geometries, resulted in the conduction network shown in FIG. 7C, where each column is represented by the nodes U1 though U9, respectively. Careful analysis of plate 60 revealed that the reasons of the conduction defects were improper electrical and wiring connections that caused both a decrease in the conduction of each column and resistive or capacitive shorts to ground potential. The theoretical solution of the network for the cases of a DC and a 2.5 MHz activation signal Va are shown in FIGS. 7D and 7E, respectively. It indicates a good agreement with the measured results shown in FIGS. 7A and 7B. The differences between the measured and the theoretical values are attributable to topographical feature influences and other nonlinearities due to less than ideal implementations of the voltage contrast detection method. Nevertheless, the general correspondence between the experimental and theoretical values confirm that the apparatus and methods of the present invention can be used to detect conduction defects of floating element FPD plates that are otherwise invisible to standard DC measurement methods.

Figure 8A:
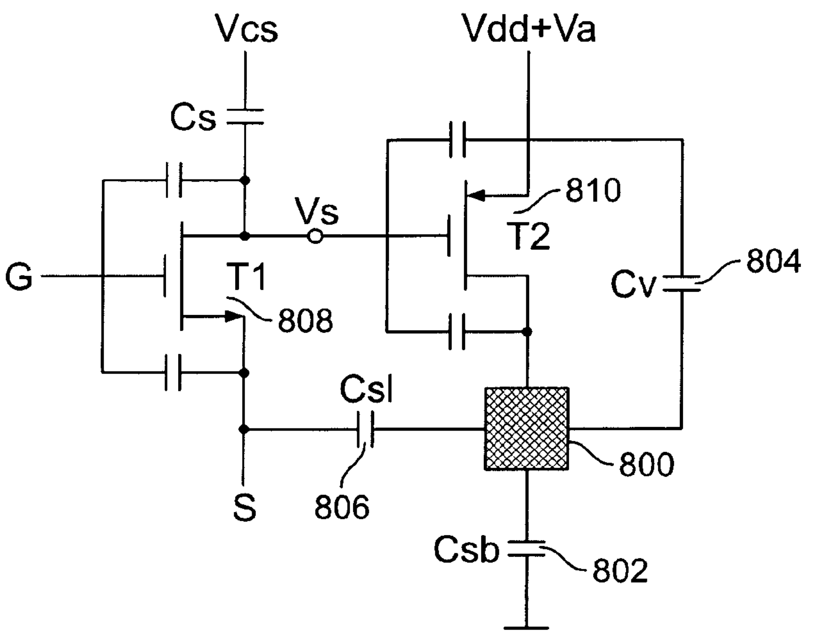
FIG. 8A shows a high frequency equivalent circuit of floating pixel element (fpe) of an uncompleted OLED FPD plate, with a high frequency signal Va superimposed on a DC bias signal Vdd, according to an embodiment of the present invention.

The test methods described above in connection with the test apparatus shown in FIG. 4 may be used to test the active plate of an uncompleted OLED FPD, according to an embodiment of the present invention. FIG. 8A shows a high frequency equivalent circuit of floating pixel element (fpe) of an uncompleted OLED FPD plate, with a high frequency signal Va superimposed on a DC bias signal Vdd, according to an embodiment of the present invention. The terminal of the yet-to-be-assembled OLED, shown schematically in FIGS. 8A–8C as a shaded square 800, may be coupled, via stray capacitances, to, for example: ground, via the underside of the substrate (assuming that the substrate is above and in closed contact to a ground plane (Csb) 802); the Vdd power signal line, which typically runs in close proximity to the pixel element (Cv) 804; and the column activation signal S which also typically runs in close proximity to the pixel element (Cs) 806. Those skilled in the art will understand that other arrangements may exist depending on, for example, the particular materials used, electrical circuit design, semiconductor layout, etc. For example, the stray capacitance 802 could be of a significantly larger value if the OLED substrate is made of a very thin plastic/polymer material instead of the typically used and relatively thick glass substrate. FIG. 8A also shows the parasitic capacitances of both TFT 808 and TFT 810, which, although relatively smaller, may in some cases affect the overall capacitive behavior of each pixel element.

It should be emphasized here that the fpe shown in FIG. 8A and other figures of this disclosure is but one of a variety of pixel element types that may be tested using the methods and apparatus of the present invention. For example, whereas the fpe in the FIG. 8A and the figures referred to below is shown as being connected in a current source mode, with a p-channel current controlling transistor 810, those skilled in the art will readily understand that other pixel element types may be tested. For example, a different pixel element might use an n-channel current controlling transistor, instead of the p-channel current controlling transistor 810 in the fpe in FIG. 8A. In such a case, the diode would be repositioned between Vdd and the drain of the n-channel transistor, rather than between drain of p-channel transistor 810 and ground. It must also be noted that the storage capacitor terminal Vcs shown in FIG. 8A, which is typically directly connected to either Vdd or ground depending of the current controlling transistor channel type (i.e. connected to Vdd for a p-channel transistor or to ground for an n-channel transistor), may be in some applications connected to an intermediate DC value. Also, the "ground" potential, as referred to above, could be of an absolute negative value with respect to Vdd. Accordingly, those skilled in the art will readily understand that other pixel element configurations, using different transistor types (i.e. n-type or p-type) and arrangements, and related positionings of the diode and the Vcs terminal, may be tested by obvious adjustments to bias, transistor connections, and to the manner in which control, test and other signals are input to and output from the fpe under test. It should also be pointed out that, for purposes of this disclosure, the words source and drain of the transistors described in this disclosure will be viewed and treated as being interchangeable.

Figure 8B:
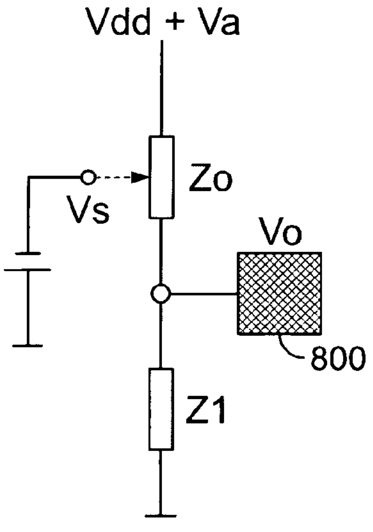
FIG. 8B shows a simplified equivalent circuit model of the fpe test setup in FIG. 8A, according to an embodiment of the present invention.
Figure 8C:
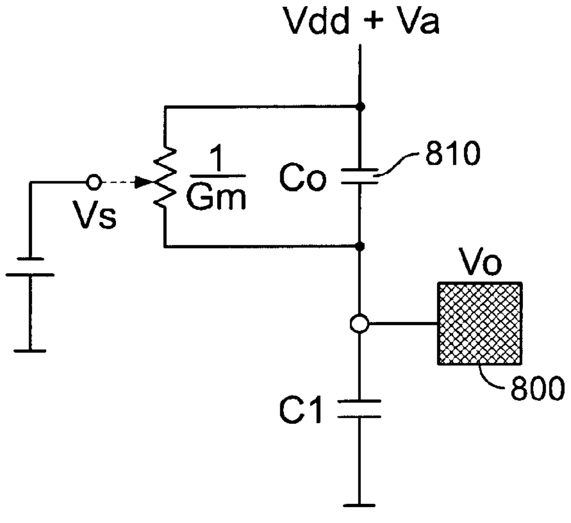
FIG. 8C shows a further simplified equivalent circuit model of the fpe test setup in FIGS. 8A and 8B, according to an embodiment of the present invention.

FIG. 8B shows an equivalent circuit model of the floating pixel element for high activation frequencies, according to an embodiment of the present invention. According to this circuit model, all stray capacitances and the impedance effects of TFT 810 are lumped into two equivalent impedances—the first, Z1, which is coupled to ground and the second, Zo, which is coupled to the to the activation source Va. The impedance Zo is variable and changes as a function of the control voltage Vs. In its most simple form, the equivalent impedance model for each fpe can be represented as shown in FIG. 8C. In that example, Zo has been replaced with a voltage controlled variable conductance model of TFT 810 in parallel with a resultant stray capacitor Co.

Figure 8D:
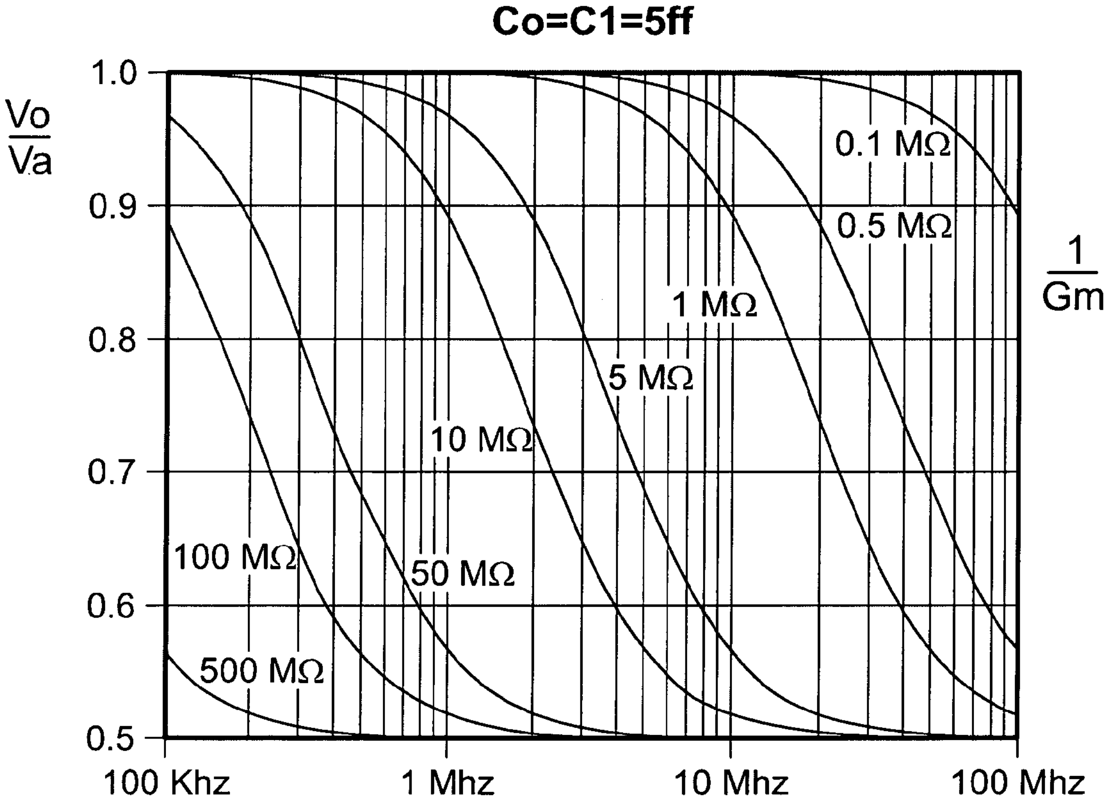
FIG. 8D shows a graph of an exemplary calculation of the expected amplitude of Vo, for several values of the inverse of the transconductance Gm, when a high frequency activation signal Va is applied to the Vdd line of the fpe in FIGS. 8A–8C, according to an embodiment of the present invention.

Optimum selection of the activation frequency of activation signal Va depends on the values of the stray capacitances present in the particular design of the OLED plate. FIG. 8D shows a graph of an exemplary calculation of the expected amplitude of Vo for several values of the inverse of the transconductance Gm, when a high frequency activation signal is applied to the Vdd line as shown in FIG. 8C. The stray capacitances Co and C1 are assumed to have the same value of 5 femtofarads ($5\times10^{-15}$ farads), the values of which were obtained from approximated geometrical calculations and electrical measurements of the AC load presented to the activation signal generator. These very small stray capacitance values justify the selection of an electron beam probe as the preferred measuring instrument for testing OLEDs. However, in some cases care must be taken such that the electron beam specimen current induced into the sample is of a sufficiently low value that it does not externally charge any stray capacitance. It has been determined that at optimum beam energy and typical stray capacitances values, a beam current of 5 nA or less will not significantly affect a high frequency voltage measurement. However, it is possible than in some cases a relatively high electron beam specimen current could be beneficial and could contribute in achieving a better or a faster measurement by using the electron beam to externally charge any of the OLED pixel elements'stray capacitances.

Figure 8E:
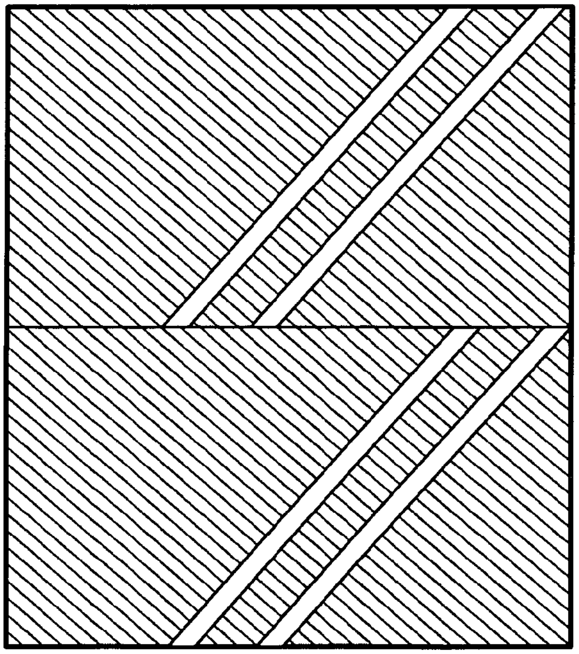
FIG. 8E shows two, two-dimensional (2-D) maps of hundreds of spatially adjacent measurements of a plurality of fpes of an OLED FPD plate, made using the methods and apparatus of the present invention.

According to another embodiment of the invention, it may also be desirable to test each pixel element at the range of transconductances encountered during normal operation of the finished OLED display. In a typical case the current Id required to activate the OLED to full scale light emission is in the range of 10 $\mu$A with a required minimum gray level requirement of 1/64 times or less. For a Vdd value of 10 V, that range corresponds to 1/Gm values ranging from approximately 930 KΩ to 59 MΩ. From FIG. 8D, it is observed that activation frequencies ranging from about 2 to 10 Mhz will provide acceptable measurement ranges of such transconductances. As was pointed out previously, the graphs shown in FIG. 8D will depend on the values of the stray capacitances Co and C1. In general terms, a simultaneous increase of both capacitances will tend to shift the 1/Gm curves to the left of the graph (lower frequencies) and a decrease to the right (higher frequencies), while a variation of C1 with respect to Co will vary the minimum obtainable Vo/Va ratio (0.5 in the example shown FIG. 8D). FIG. 8E shows two, two-dimensional (2-D) maps of hundreds of spatially adjacent measurements of a plurality of fpes of an OLED FPD plate, made using the methods and apparatus of the present invention. The measurements were taken with an activation frequency of 2.5 MHz and at two arbitrary values of Vs. The maps show defective column defects characterizing what appear to be unusual levels of high and low conductances with respect to the neighboring pixel elements. The top 2-D map was obtained with a Vs value that corresponded to a higher TFT 810 conductance and the bottom one to a lower. Both 2-D map images have been contrast-stretched for better printing quality purposes.

Figure 9A:
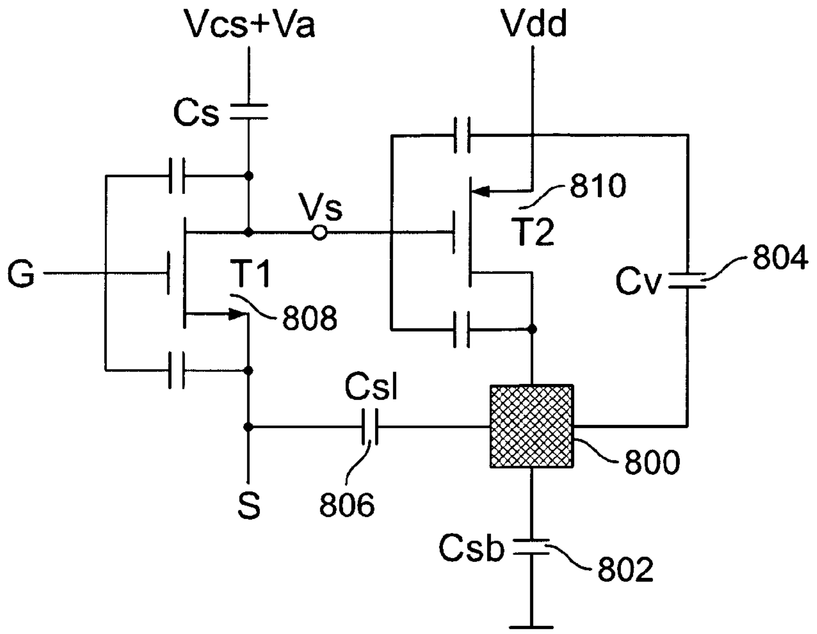
FIG. 9A shows a high frequency equivalent circuit of floating pixel element (fpe) of an uncompleted OLED FPD plate, with a high frequency signal Va superimposed to the Vcs line of the fpe, according to an embodiment of the present invention.
Figure 9B:
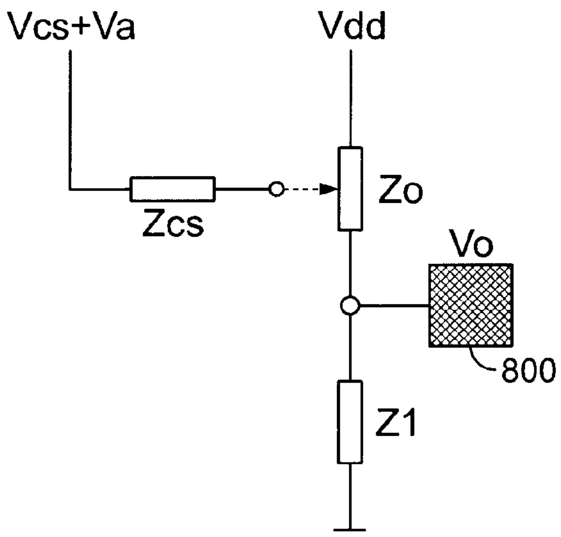
FIG. 9B shows a simplified equivalent circuit model of the fpe test setup in FIG. 9A, according to an embodiment of the present invention.
Figure 9C:
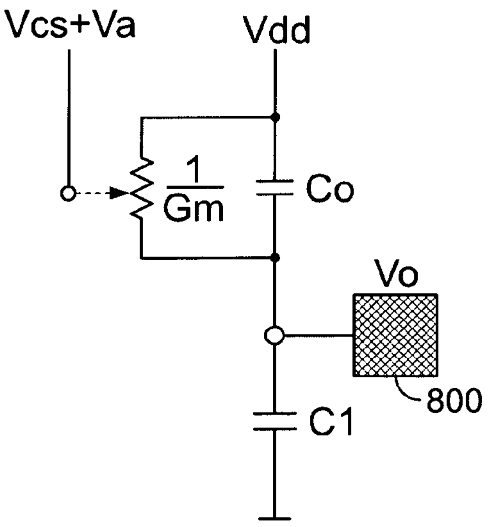
FIG. 9C shows a further simplified equivalent circuit model of the fpe test setup in FIGS. 9A and 9B, according to an embodiment of the present invention.

According to an alternative embodiment of the invention, it may be possible to achieve similar results, as to those already described, by applying a high frequency signal to the Vcs line, rather than to the Vdd line. This approach is shown schematically in FIG. 9A. According to this approach, the voltage that controls the transconductance of TFT 810 could be composed of a high frequency AC component added to a DC signal. The AC component will cause a high frequency modulation of the impedance Zo (see FIG. 9B), which in the simplified electrical model, corresponds to a modulation of the 1/Gm impedance value (FIG. 9C). This causes a high frequency variation of the amplitude of the waveform Vo present on the floating pixel element. This waveform amplitude can also be measured using the methods and apparatus of the present invention described above. An advantage of this alternative approach is that both the S and G activation lines could remain inactive (TFT 808 switch permanently in its off state), thereby providing for a potentially faster and a more controlled method for testing the transconductance of TFT 810. Also, by eliminating the need for activation of the G and S lines and other related signals, the required electrical contact probing complexity could potentially be reduced, thereby providing substantial cost reduction benefits.

FIGS. 10A–E shows some examples of testing sequences applied to an OLED plate having fpes similar to the fpe shown in FIG. 8, according to embodiments of the present invention. In these particular examples, it is assumed that the current controlling transistor T2 is a p-channel type and is operating in current source mode (i.e. its source terminal connected to Vdd and the drain to the OLED fpe), that the storage capacitor terminal Vcs is connected to Vdd, and that the control transistor T1 is an n-channel type. Those skilled in the art will readily understand that the biasing and test signal characteristics may need to be modified to test other pixel element types. For example, in the case of a p-channel control transistor, the gate voltage signal G will be inverted with respect to the ones shown in FIGS. 10A–C. For clarity, the figures show only the high frequency AC activation signals and not the DC components, which have been replaced with dotted lines.

Figure 10A:
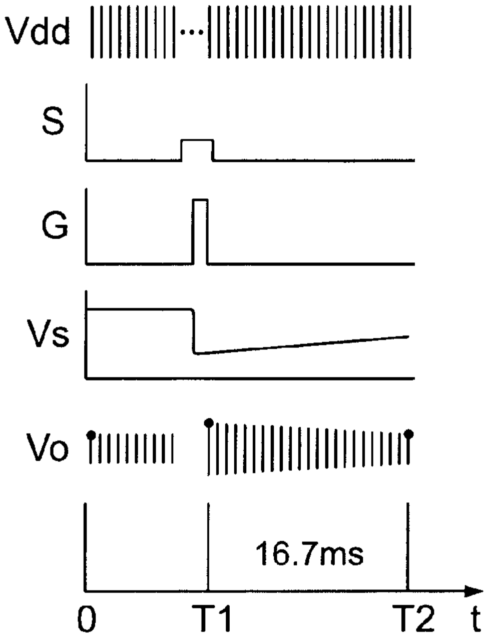
FIGS. 10A–10E show various examples of testing sequences of OLED substrate plates that may be applied, according to embodiments of the present invention.

FIG. 10A shows a method for testing an overall Go-No-Go performance. At t=0, the amplitude of Vo is measured for testing an OFF state condition. Immediately the pixel element is fully activated ON. At t=T1, the amplitude of Vo is measured for testing an ON state condition. A period corresponding to one frame rate, for example, 16.7 ms, is waited, and at t=T2 the amplitude of Vo is measured again to test for a leakage defect condition. A pixel is considered to have passed the Go-No-Go test only if all three measurements fall within acceptable predefined ranges.

Figure 10B:
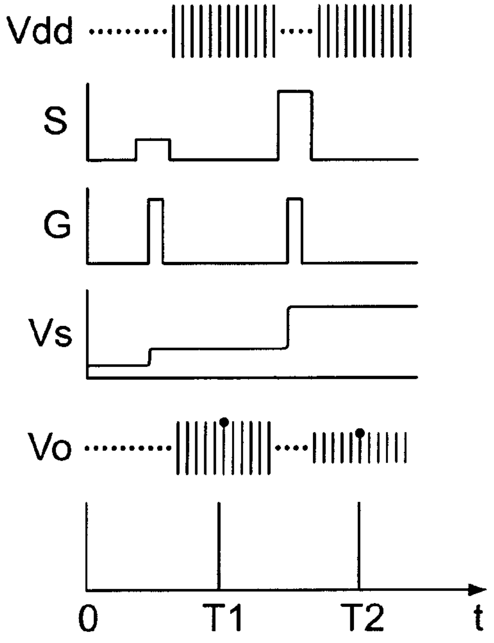

FIG. 10B shows a method for testing the transconductance Gm. The pixel is activated to a predetermined value and at t=TI the amplitude of Vo is measured. Then the pixel is activated to a second predetermined value, and at t=T2 the amplitude of Vo is measured again. The delta of variations gives an indication of Gm.

Figure 10C:
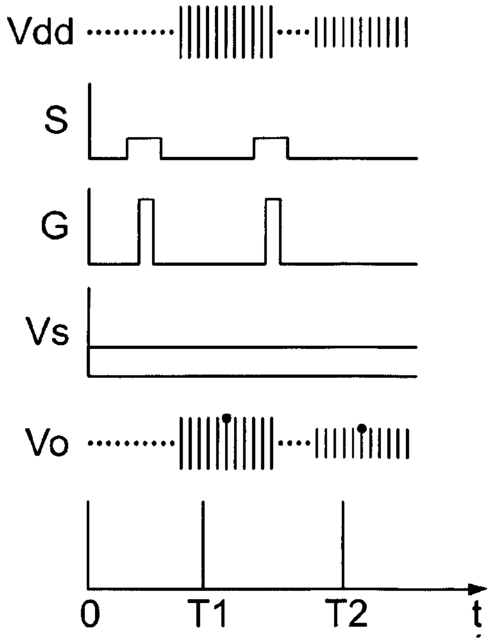

FIG. 10C shows a method for testing the channel or drain conductance (Gd). The pixel is activated to a predetermined value, and at t=T1 the amplitude of Vo is measured. Then, the pixel is activated to the same predetermined value as before, but the amplitude of the high frequency signal in Vdd is varied to a second value. At t=T2 the amplitude of Vo is measured again. The delta of variations gives an indication of Gd.

Figure 10D:
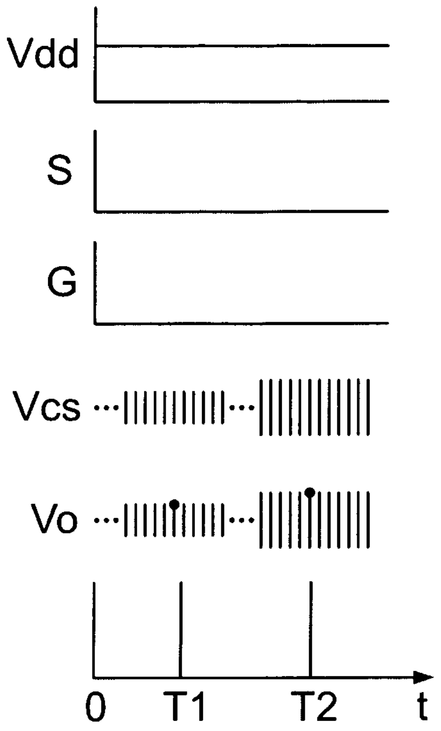

FIG. 10D shows a method for testing the transconductance Gm using the alternative approach shown in FIG. 9. The Vcs line is activated with a high frequency signal of a predetermined amplitude, and at t=T1 the amplitude of Vo is measured. Then, the amplitude of the high frequency signal in Vcs is varied to a second value, and at t=T2 the amplitude of Vo is measured again. The delta of variations gives an indication of Gm.

Figure 10E:
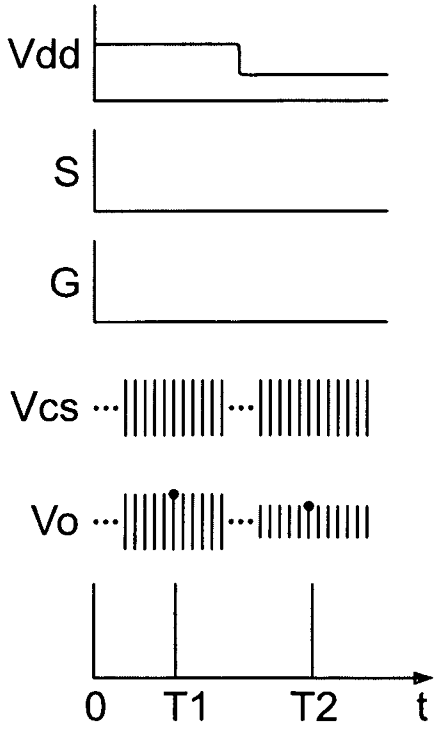

FIG. 10E shows a method for testing the channel or drain conductance Gd using the alternative approach shown in FIG. 9. The Vcs line is activated with a high frequency signal of a predetermined amplitude, and at t=T1 the amplitude of Vo is measured. Then, Vcs is activated with a high frequency signal at the same predetermined amplitude, but Vdd is varied to a second value. At t=T2 the amplitude of Vo is measured again. The delta of variations gives an indication of Gd.

The foregoing detailed description describes methods of and apparatus for testing unfinished FPD plates, according to various embodiments of the present invention. Whereas the description is a complete description of the preferred embodiments of the invention, various alternatives, modifications, and equivalents may be used. For example, whereas the design implementation of the pixel element driving circuit shown in FIG. 8A is shown to comprise only a single TFT, the methods and apparatus of the present invention can just as well be applied to other pixel element driving circuit arrangements. For an example of another method of driving an OLED pixel element, refer to the publication "P-103: Novel Poly-Si TFT Pixel Electrode Circuits and Current Programmed Active-Matrix Driving Methods for AM-OLEDs", Y. Hong et. al., SID 02 Digest. According to this method, Hong describes an arrangement of four TFTs for each pixel element, two of which provide the driving current to the OLED. Hence, those skilled in the art will readily understand that the basic principles of the present invention extend to other pixel elements having different pixel driving circuitry. Additionally, whereas the disclosure describes an OLED structure for an FPD in which light is emitted through the substrate in a down-emitting stack configuration, and where the floating pixel elements are formed with an ITO layer etched into the substrate, which allows the light to pass through it and a transparent substrate, the invention is applicable to other types of OLED structures. For example, the testing methods and apparatus may also be used to test plates of an OLED structure in which light is emitted in an up-emitting manner. According to this structure, the floating pixel elements are formed with a nontransparent metallic layer etched into the substrate causing light emission though a ITO layer located above the OLED layers. Hence, one skilled in the art would find it is obvious that the present invention is also applicable to the case of an up-emitting stack, in which case the floating pixel elements are made of a metallic layer instead of ITO. For these and other reasons, therefore, the above description should not be taken as limiting the scope of the invention as it is defined by the appended claims.

What is claimed is:

1. A method of determining pixel defects in an FPD plate, comprising:

activating an FPD plate with an AC test signal;

at a point on the FPD plate corresponding to a location of a pixel element, measuring the amplitude of a signal that is responsive to the AC test signal;

comparing the amplitude of the measured signal to a predetermined amplitude; and determining whether the difference between the measured and predetermined amplitudes represents that the pixel element is defective, wherein the pixel element comprises:

a control transistor having a gate configured to receive a row or column selection signal, a drain and a source;

a storage element coupled between a first power supply potential and the drain of said control transistor; and a current controlling transistor having a gate coupled to the drain of said control transistor, a source coupled to a second power supply potential, and a floating drain.

2. The method of claim 1 wherein said activating the FPD plate with an AC test signal is performed by coupling the AC test signal to the source of said current controlling transistor.

3. The method of claim 1 wherein said activating the FPD plate with an AC test signal is performed by coupling the AC test signal to the drain of said control transistor.

* * * * *